United States Patent [19]
Molnar

[11] Patent Number: 5,850,355
[45] Date of Patent: Dec. 15, 1998

[54] SYSTEM FOR CHARACTERIZATION OF MULTIPLE-INPUT CIRCUITS

[75] Inventor: Charles E. Molnar, Sunnyvale, Calif.

[73] Assignee: Sun Microsystems, Inc., Palo Alto, Calif.

[21] Appl. No.: 603,515

[22] Filed: Feb. 20, 1996

[51] Int. Cl.⁶ .................................................. G06F 17/50
[52] U.S. Cl. ........................ 364/578; 364/488; 364/489; 364/490
[58] Field of Search ................... 364/488, 487, 364/490, 491, 578; 395/500

[56] References Cited

U.S. PATENT DOCUMENTS

| | | | |
|---|---|---|---|
| 4,878,179 | 10/1989 | Larsen et al. | 364/490 |
| 5,105,374 | 4/1992 | Yoshida | 364/578 |
| 5,345,401 | 9/1994 | Tani | 364/578 |
| 5,365,463 | 11/1994 | Donath et al. | 364/578 |
| 5,384,720 | 1/1995 | Ku et al. | 364/578 |
| 5,410,673 | 4/1995 | Oguri | 395/500 |
| 5,572,717 | 11/1996 | Pedersen | 395/555 |
| 5,576,979 | 11/1996 | Lewis et al. | 364/578 |
| 5,608,645 | 3/1997 | Spyrou | 364/491 |

OTHER PUBLICATIONS

Rogina et al. ("Metastability Evaluation Method by Propagation Delay Distribution Measurement," IEEE, The Fourth Asian Test Symposium, 11 Nov. 1995, pp. 40–44).

Hernandez et al. ("GASTIM: A timing analyzer for GaAs digital circuits", IEEE Comput. Soc. Press, Proceedings of EURO–DAC 93 and EURO–VHDL 93—European Design Automation Conference, 20 Sep. 1993, pp. 190–195).

Chakraborty et al. ("Simulation of at–speed tests for stuck–at faults", IEEE Comput. Soc. Press, Proceedings of 13the IEEE VLSI Test Symposium, 30 Apr. 1995, pp. 216–220).

Cirit ("Characterizing a VLSI standard cell library", IEEE, Proceedings of the IEEE 1991 Custom Integrated Circuits Conference, 12 May 1991, pp. 25.7.1–25.7.4).

Hall ("Digital board simulation: getting started with ease and speed", IEEE Potentials, Apr. 1995, pp. 34–38).

Min et al. ("Boolean Process–An Analytical Approach to Circuit Representation(II)", IEEE Comput. Soc. Press, Proceedings of the Fourth Asian test Symposium, 23 Nov. 1995, pp. 26–32).

Primary Examiner—Kevin J. Teska
Assistant Examiner—Phallaka Kik
Attorney, Agent, or Firm—Townsend and Townsend and Crew LLP

[57] ABSTRACT

A technique has been described of characterizing the timing behavior of circuits with multiple input terminals. The technique allows determination of minimum and maximum delays. Additionally, it provides the precise circuit behavior as the relationship among the input signals changes with respect to the average of the input signal times to exhibit domination by the later arriving signal or regimes where the delay is affected by more than one input signal.

12 Claims, 3 Drawing Sheets

SYSTEM FOR CHARACTERIZATION OF MULTIPLE-INPUT CIRCUITS

BACKGROUND OF THE INVENTION

Many circuits receive input signals on more than one input terminal, and produce output signals only after multiple required input signal changes have occurred on multiple input terminals. We call such circuits multiple-input circuits. Usually, the time at which the output signal occurs depends not only upon the arrival time of the latest required input signal, but also upon the prior arrival times of other required input signals.

In conventional circuit analysis and design, simple models are used which represent circuit operation as providing the output signal after a fixed delay following the arrival of the last required input signal. This is typical of conventional logic simulation tools, various logic modeling tools, and other well known simulation techniques.

With the advent of increasingly high speed circuits, the errors introduced by such simple characterizations of circuit behavior are becoming increasingly unacceptable. Furthermore, high performance system designs frequently allow multiple required input signals to a circuit to occur at nearly the same time. Hence, even small errors as a result of this simplifying assumption may become significant and lead either to unreliable operation, or needless sacrifice of system speed.

SUMMARY OF THE INVENTION

This invention provides a technique for overcoming the disadvantages and inaccuracies of prior art techniques for characterizing the timing behavior of circuits. The technique of this invention is particularly applicable to circuits with two input signals; however, it may readily be extended to circuits having arbitrarily large numbers of input signals. The invention provides a representation of the timing behavior.

In one embodiment of the invention, a system for producing a representation of the time delay inherent in a logic device includes a source of stimulation signals which provides input signals to drive each of the input nodes or terminals of a logic device. The source of input signals is capable of providing the input signals in different time relationships with respect to each other. A detector is coupled to receive output signals supplied by the logic device. A computer is connected to control the source of stimulation signals to cause it to produce input signals in different time relationships to each other, and is connected to the detector to determine the time relationship of the resulting output signal with respect to the input signals. By repeatedly activating the source of stimulation signals to produce input signals in different time relationships with each other, a characterization of the behavior of the output signal can be made. This representation can be stored or displayed to the user, employed in a logic simulator, or otherwise utilized.

DESCRIPTION OF THE SPECIFIC EMBODIMENT

Figure 1:
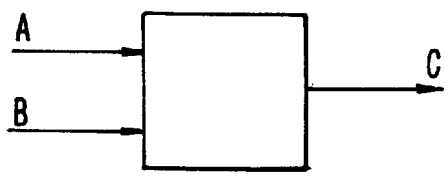
FIG. 1 is a block diagram illustrating a multiple-input circuit.

FIG. 1 illustrates a circuit which is connected to receive input signals A and B, and in response provide output signal C. For the purposes of illustration throughout the remainder of this description, the circuit shown in FIG. 1 will be described as being an AND circuit. It will be appreciated, however, that any circuit which produces output signals in response to input signals, with an arbitrary number of input terminals and output terminals could be employed in place of the AND circuit.

Figure 2:
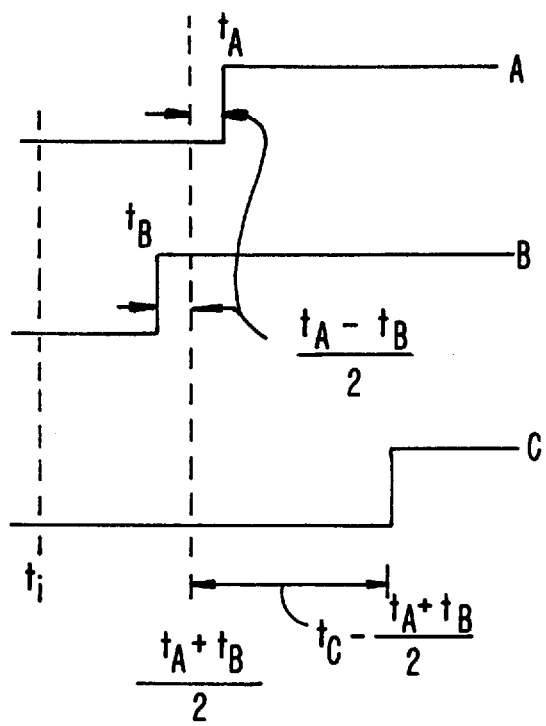
FIG. 2 is a timing diagram illustrating the timing of input and output signals to the circuit of FIG. 1.

The AND circuit of FIG. 1 produces an output signal C after it receives both an input signal A and an input signal B. FIG. 2 illustrates one possible timing relationship of the input signals shown in FIG. 1. Again, for the sake of explanation, assume that the input signals A and B are both low at some initial time $t_i$, and at some later time, as shown in FIG. 2, the input signals switch to a higher level. Classically, the change in state of input signals A and B from a low level to a high level represents a transition from 0 to 1. As shown in the figures, assume that input signal A switches to the higher level at time $t_A$, while the input signal B switches to a higher level at time $t_B$. In the drawings $t_B$ is illustrated as earlier than $t_A$, but it could be in any time relationship. One can consider terminal A as having an event at time $t_A$ and terminal B having an event at time $t_B$. In response to these events, the AND circuit will produce an event C at time $t_C$, also in the form of a zero-to-one level change.

Although the circuit produces output signal C only after both input signals A and B have occurred, it is an oversimplification to believe that the time $t_C$ at which the output signal C occurs is simply the later of time $t_A$ or $t_B$, followed by a "circuit propagation" delay. For example, depending upon the specific circuit embodiment, the circuit delay may be asymmetric with respect to input signals A and B.

The waveforms of FIG. 2 have been labelled to illustrate an improved technique for measuring and therefore predicting, the transition event for the delay of the circuits shown in FIG. 1 as dependent on the relationship between the times of its inputs. For the sake of explanation, assume that input signal A occurs slightly later than the thus far received input signal B. As shown by the dashed line extending vertically through FIG. 2, the average input transition time is given by $(t_A+t_B)/2$. The difference between this average time and the first-to-arrive signal, $t_B$ as depicted, is $(t_A-t_B)/2$. Finally, we can express the circuit propagation delay until the event on output signal C as $[t_C-(t_A+t_B)/2]$.

Figure 3:
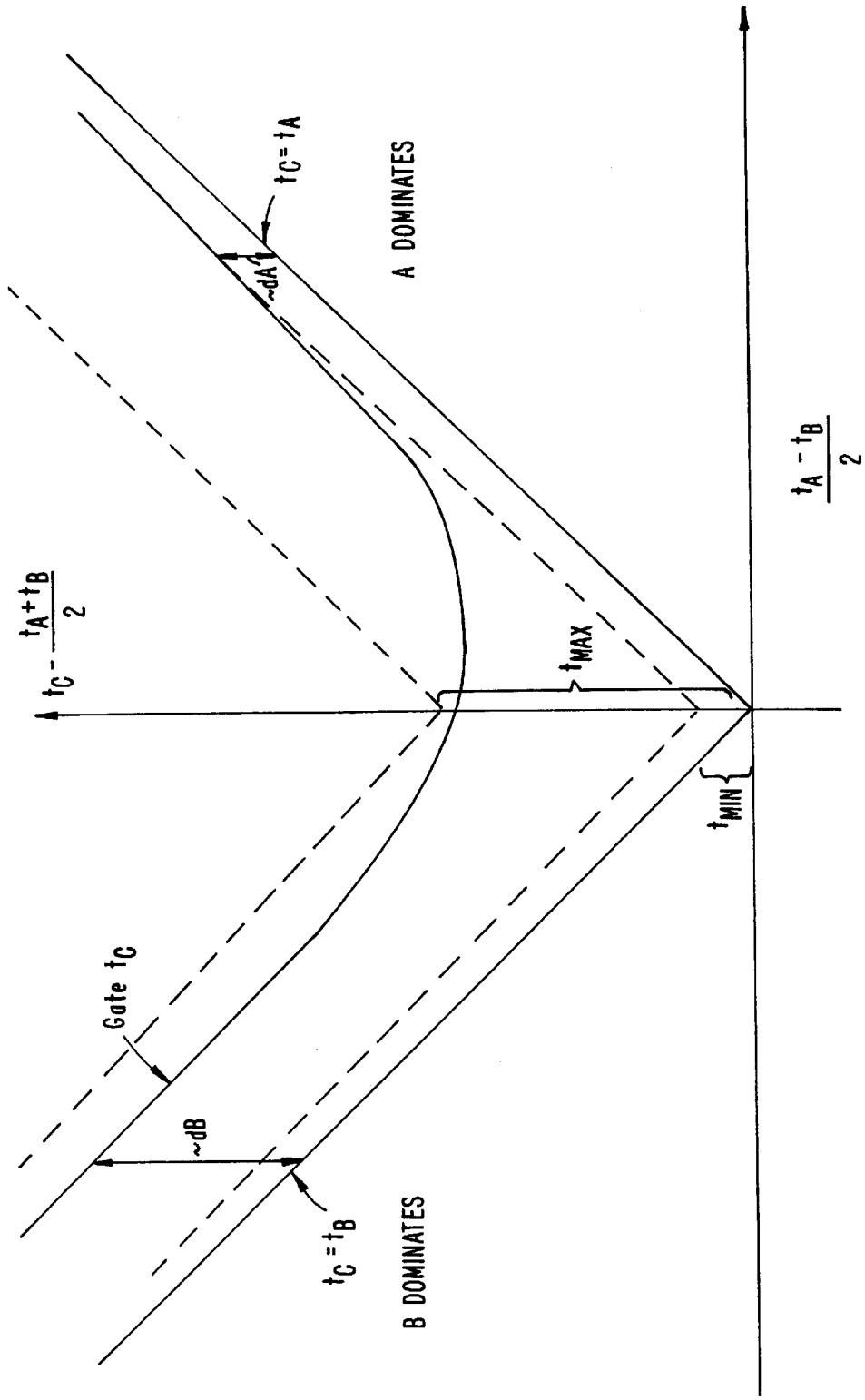
FIG. 3 is a diagram illustrating the differing delay intervals dependent upon the differing arrival times of the input signals.

FIG. 3 provides the results of a reasonably realistic example of the relationship among signals A, B, and C. In FIG. 3 the X axis indicates the difference between the input arrival times $(t_A-t_B)/2$, while the Y axis plots the circuit delay measured from the average arrival time, in other words $[t_C-(t_A+t_B)/2]$. Thus, in the limit, as $t_A$ becomes much later than $t_B$, the output signal event time $t_C$ is dominated by input signal A, and the delay curve is essentially parallel to the asymptote labeled $t_C=t_A$. In other words, in this extreme the precise arrival time $t_B$ of input signal B has no affect on the time $t_C$ of the output signal C.

Similarly, in the limit, as time $t_B$ for the arrival of input signal B becomes much later than time $t_A$ for the arrival of input signal A, a corresponding behavior occurs. That is, the operation of the circuit in response to the second-to-arrive signal, in this case $t_B$, becomes essentially independent of the arrival time of the first-to-arrive signal, in this case, $t_A$, and instead is dominated by the later arriving input signal B.

In the region where $t_A$ and $t_B$ are not too far separated in time, there will be a smooth transition between the two limit values reflecting the interaction of input signal A with input signal B. This is often the region of most interest in high performance circuits, and is the region of the graph between the region in which signal A dominates and the region in which signal B dominates.

Thus, as illustrated in FIG. 3, there is a range of behavior in which $t_C$ follows $t_B$, a range of behavior in which $t_C$ follows $t_A$, and an intermediate range. In the example depicted, the minimum delay is when $t_C$ is dominated by $t_A$, while the maximum delay occurs where both input signals arrive nearly at the same time, making $t_A - t_B$ nearly zero. Once the curve shown in FIG. 3 is determined, a mathematical equation approaching the shape of the curve as a function of the input parameters may be determined.

An additional possible effect can result when there is more than one event on one of the input terminals. For example, it is possible to have two events on one terminal interact with a single event on another input terminal. In such a cases the overall circuit performance will be controlled by the combination of the events, just as in cases where only two events occur.

One use of the curve shown in FIG. 3 is in simulation of logic designs. Logic simulators verify that the logic of a circuit is correct before a circuit is designed in detail. The logic simulator simulates gates and functional elements, such as flip-flops and registers, to predict the output of a circuit statically, for example as a truth table, or dynamically, for example as a function of time. In most logic simulators, signal transitions are regarded as instantaneous, whereas in a circuit simulator they are typically regarded as occupying a certain time interval. Typical state of the art logic simulators, for example as provided by Verilog, regard gate output signals as occurring a fixed time interval after the last required signal is received at one of the input nodes. As described herein, such assumptions are not completely accurate, and by employing the techniques described herein increased accuracy in logic simulators is provided. With high performance circuits such as now being designed and sold, and correspondingly short time intervals between inputs required to produce an output.

Two effects shown in FIG. 3 are:
 (a) a different delay if $t_A$ is later or $t_B$ is later, when $t_A$ and $t_B$ are far apart;
 (b) a complex interaction (shown by the curved part of the delay curve) when $t_A$ and $t_B$ are close enough.

The simplest current simulator models restrict the delay to be the same whether $t_A$ or $t_B$ is last and whether they are occur close together or far apart.

Ignoring the effects shown in FIG. 3 can result in an unexpectedly early or late transition of an output signal that can cause a serious logic error. For this reason, the technique described in FIG. 3 has particular utility in logic simulators.

Figure 4:
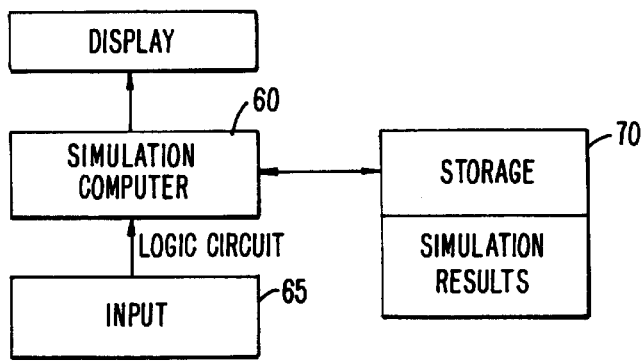
FIG. 4 illustrates a logic simulator utilizing the relationship shown in FIG. 3.

FIG. 4 illustrates such a simulator. As shown, a simulation computer 60 receives initial information about a logic circuit 65. The computer 60 is connected to a storage unit 70. Computer 60, the logic simulation software controlling it, the storage unit 70, and the manner in which information about the logic circuit 65 is introduced are all well known commercially available products. By using the technique described above, however, the logic simulation results in storage 70 can include the effects shown in FIG. 3.

For such logic simulators, the behavior of the simulated circuit can include accommodation also for the influence of the order of the arrival of signals at the input terminals. This invention makes possible consideration of the interacting effect of several input signals when their timing is close together, enabling more accurate simulation.

Figure 5:
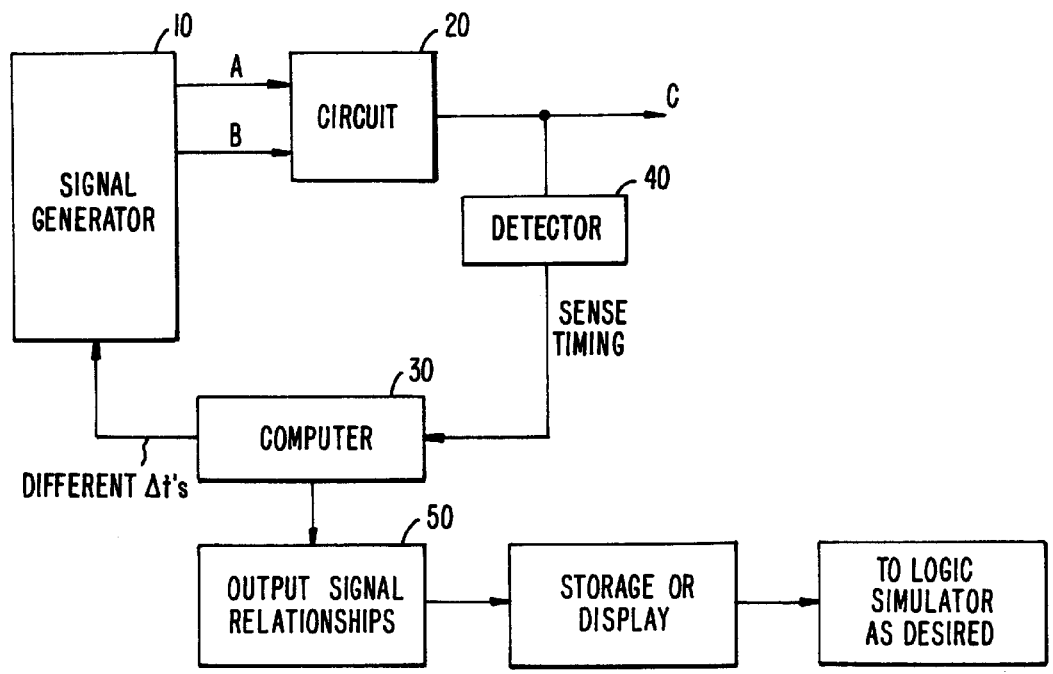
FIG. 5 is a block diagram illustrating the apparatus used to determine the relationships shown in FIG. 3.

FIG. 5 illustrates apparatus for obtaining the results 50 shown in FIG. 3 from measurements of a physical circuit. As shown in FIG. 5, a signal generator 10 is coupled to the input nodes A and B of a circuit 20. The circuit 20 has an output node C to which is connected to a detector 40, or other suitable apparatus. The detector 40 detects the output signal on node C and supplies that information to the computer 30. The computer 30 detects the transitions in the output signal C, and "exercises" the input signals A and B to provide a variety of combinations and timing relationships of input signals. In this manner, with a sufficient number of tries a characterization of the circuit for different input time relationships can be obtained. A graphical representation of this data 50 as shown in FIG. 3, can be presented on a display. This representation can be displayed or stored for later use as desired as shown in FIG. 4. Of course, for the sake of simplicity and explanation, only a two-input AND circuit has been employed in the example described above. In reality, multiple input nodes may be employed, resulting in multidimensional output plots of which two dimensions are typified by FIG. 3.

An alternative method for obtaining the results 50 shown in FIG. 3 used a circuit-level simulator such as Spice to calculate the time $t_C$ of an output signal on terminal C from the times $t_A$ and $t_B$ of input signals on terminals A and B. Such a circuit simulation typically would simulate the entire test circuit 50 and in particular the behavior of a simulation model of the circuit 20.

The data characterizing the circuit behavior, as obtained by measurement or circuit simulation, may be represented in many forms for use in logic simulator 60 of FIG. 4. One form might use an algebraic expression that best fits the data. A second form might use a piece-wise linear approximation to the data. A third form could characterize the data in terms of the three regions, referred to as a three-region representation herein. A fourth form might represent the delay as lying between a minimum and a maximum delay from the later arriving input. This form is illustrated in FIG. 3 by the dotted V-shaped lines. The spacing between the origin and the point of the upper V, labeled Tmax in the figure, is the maximum delay after the later arriving input. The spacing between the origin and the point of the lower V, labeled Tmin in the figure, is the minimum delay after the later arriving input. Certain known logic simulators can use delay bounds of this kind. Other forms in which to represent the data as well known in the art might also be used.

The foregoing invention has been described in detail by way of illustration and example. For purposes of clarity of understanding, it will be obvious that certain changes and modifications may be practiced within the scope of the appended claims.

What is claimed is:

1. A system for producing a representation of the timing sensitivity of a logic device to small variations in the arrival time of each of a plurality of input signals to the logic device, the logic device providing an output signal in response to the input signals, the timing sensitivity being determined over a range of arrival times predominantly shorter than the time required for the logic device to change from one state to another, the system comprising:

a source of stimulation signals for producing input signals to drive each of a plurality of input nodes of the logic device, the source being capable of providing the input signals in different time relationships with respect to each other, the difference in time relationships of the input signals being predominantly shorter than the time delay for the logic device to change from one state to another;

a detector connected to at least one output node of the logic device for sensing the output signal supplied by the logic device;

a computer coupled to control the source of stimulation signals to cause the source of stimulation signals to produce input signals in different time relationships to each other and coupled to the detector for determining the time relationship of the output signal with respect to the input signals, the computer repeatedly activating the source of stimulation signals in different time relationships to each other;

a storage for storing a representation of the resulting time relationship of the output signal with respect to the plurality of input signals, the representation including a first portion where the arrival time of one of the input signals dominates the time of occurrence of the output signal, a second portion where the arrival time of another of the input signals dominates the time of occurrence of the output signal, and a third portion representing a transition between the first and the second portions; and wherein the time relationship of the output signal to the input signals is expressed as a delay in the arrival of the output signal with respect to the average arrival time of the input signals.

2. A system as in claim 1 further comprising a display for displaying the relationship between the output signal and the input signals as a delay in the arrival of the output signal with respect to the average arrival time of the input signals.

3. A system as in claim 2 wherein the representation of the time relationship between the input signals and the output signal is not linear.

4. A system as in claim 3 wherein the system, after determining the time relationship between the input signals and the output signal, expresses such relationship as one of an algebraic relationship, a piece-wise linear approximation, a minimum and maximum delay, or a three-region representation.

5. A method for producing a representation of the timing sensitivity of a logic device to small variations in the arrival time of each of a plurality of input signals to the logic device, the logic device providing an output signal in response to the input signals, the timing sensitivity being determined over a range of arrival times predominantly shorter than the time required for the logic device to change from one state to another, the method comprising:

using a source of stimulation signals, producing input signals to drive each of a plurality of input nodes of the logic device, the source being capable of providing the input signals in different time relationships, the time relationships of the signals being predominantly shorter than the time required for the logic device to change state;

coupling a detector for sensing an output signal supplied by the logic device to at least one output node of the logic device;

producing stimulation signals in different time relationship to each other;

using the detector, determining the time relationship of the output signal with respect to the input signals by repeatedly activating the source of stimulation signals in different time relationship to each other, the time relationship including a first portion where the arrival time of one of the input signals dominates the time of occurrence of the output signal, a second portion where the arrival time of another of the input signals dominates the output signal, and a third portion representing a transition between the first and the second portions; and wherein the tine relationship of the output signal to the input signals is expressed as a delay in the arrival of the output signal with respect to the average arrival time of the input signals.

6. A method as in claim 5 further comprising the step of representing the time relationship of the output signal with respect to the difference in time of the input signals by an equation.

7. A method as in claim 6 further comprising the step of using the equation determined to predict the behavior of a circuit having at least two input terminals.

8. A method as in claim 5 further comprising a display for displaying the relationship between the output signal and the input signals as a delay in the arrival of the output signal with respect to the average arrival time of the input signals.

9. A method as in claim 8 wherein the time relationship between the input signals and the output signal is not linear.

10. A method as in claim 9 wherein the system, after determining the time relationship between the input signals and the output signal, expresses such relationship as one of an algebraic relationship, a piece-wise linear approximation, a minimum and maximum delay, and a three-region representation.

11. A method for producing a simulation of the timing sensitivity of a logic device to small variations in the arrival time of each of a plurality of input signals to the logic device, the logic device providing an output signal in response to the input signals, the timing sensitivity being determined over a range of arrival times predominantly shorter than the time required for the logic device to change from one state to another, the method comprising:

using a circuit simulator, producing simulated input signals to drive each of a plurality of simulated input nodes of a simulated logic device, the simulated input signals being in different time relationships with respect to each other, the difference in time relationships of the simulated input signals being predominantly shorter than the time delay for the logic device to change from one state to another;

simulating the coupling of a simulated detector for sensing a simulated output signal supplied by the simulated logic device to at least one simulated output node of the logic device;

producing simulated stimulation signals in different time relationship to each other;

using the simulated detector, determining the time relationship of the simulated output signal with respect to the simulated input signals by repeatedly activating the simulated source of stimulation signals in different time relationship to each other using the detector, determining the time relationship of the output signal with respect to the input signals by repeatedly activating the source of stimulation signals in different time relationship to each other, the time relationship including a first portion where the arrival time of one of the input signals dominates the time of occurrence of the output signal, a second portion where the arrival time of another of the input signals dominates the output signal, and a third portion representing a transition between the first and the second portions; and wherein the time relationship of the output signal to the input signals is expressed as a delay in the arrival of the output signal with respect to the average arrival time of the input signals.

12. A system for simulating behavior of sensitivity of a logic circuit to small variations in the arrival time of each of a plurality of input signals to the logic circuit, the logic circuit providing an output signal in response to the input signals, the timing sensitivity being determined over a range of arrival times predominantly shorter than the time required for the logic device to change from one state to another, the system comprising:

a computer;

means for introducing into the computer a representation of a logic circuit to be simulated;

a computer program operating on the computer to provide information about behavior of the logic circuit to be simulated, the behavior including information about the timing relationships between an output signal supplied from a logic elements in the logic circuit, and input signals supplied to that logic element, the timing relationships having variations therein predominantly shorter than a time interval required for the logic circuit to change state;

storage in the computer for storing a representation of the time relationship of the output signal with respect to the plurality of input signals, the representation including a first portion where the arrival time of one of the input signals dominates the arrival time of the output signal, a second portion where the arrival time of another of the input signals dominates the output signal, and a third portion representing a transition between the first and the second portions; and wherein the time relationship of the output signal to the input signals is expressed as a delay in the arrival of the output signal with respect to the average arrival time of the input signals.

* * * * *